(12) United States Patent
Inoue

(10) Patent No.: US 6,282,677 B1
(45) Date of Patent: Aug. 28, 2001

(54) INTERLEAVING APPARATUS

(75) Inventor: Kouichi Inoue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/280,544

(22) Filed: Mar. 30, 1999

(30) Foreign Application Priority Data

Oct. 14, 1998 (JP) .................................................. 10-291748

(51) Int. Cl.[7] ............................ G06F 11/00; H03M 13/03
(52) U.S. Cl. ............................ 714/701; 714/786; 714/788
(58) Field of Search .................................... 714/701, 700, 714/762, 786, 787, 788, 790, 791, 792; 341/81, 106; 375/243, 261; 377/64

(56) References Cited

U.S. PATENT DOCUMENTS

| 3,652,998 | * | 3/1972 | Forney, Jr. | 377/64 |
| 4,677,624 | * | 6/1987 | Betts et al. | 714/792 |
| 4,677,626 | * | 6/1987 | Betts et al. | 714/792 |
| 5,719,875 | * | 2/1998 | Wei | 714/701 |

* cited by examiner

*Primary Examiner*—Emmanuel L. Moise
(74) *Attorney, Agent, or Firm*—Venable; Robert J. Frank; Allen Wood

(57) ABSTRACT

An interleaving apparatus is provided which stores input bits temporarily and transfers some of the bits only required to execute an operation to code each of the stored bits to a coding circuit. This allows a storage region to be decreased as compared with a conventional system.

6 Claims, 9 Drawing Sheets

*Fig.2*

| 1 | 2 | 3 | 4 | 5 | 6 | 7 | 8 | ~ | 283 | 284 | 285 | 286 | 287 | 288 |

Fig.5

| PRE-OPERATION VALUE / REGISTER | A8 | A7 | A6 | A5 | A4 | A3 | A2 | A1 |
|---|---|---|---|---|---|---|---|---|
| ~16 | s8 | s7 | s6 | s5 | s4 | s3 | s2 | s1 |
| ~32 | t8 | t7 | t6 | t5 | t4 | t3 | t2 | t1 |
| ~48 | u8 | u7 | u6 | u5 | u4 | u3 | u2 | u1 |
| ~64 | v8 | v7 | v6 | v5 | v4 | v3 | v2 | v1 |
| ~272 | z8 | z7 | z6 | z5 | z4 | z3 | z2 | z1 |

Fig.7

| 1 | 2 | 3 | 4 | 5 | 6 | 7 | ⁓ | 284 | 285 | 286 | 287 | 288 |

Fig.8

| 1a | 17a | 33a | 65a | 81a | 97a | 113a | ⁓ | 224b | 240b | 256b | 272b | 288b |

Fig.10

| | | | | | | | | | | | | | | | |
|---|---|---|---|---|---|---|---|---|---|---|---|---|---|---|---|
| LINE 1 | 1a | 17a | 33a | 49a | 65a | 81a | 97a | 113a | 129a | 145a | 161a | 177a | 193a | 209a | 225a | 241a | 257a | 273a |
| LINE 2 | 1b | 17b | 33b | 49b | 65b | 81b | 97b | 113b | 129b | 145b | 161b | 177b | 193b | 209b | 225b | 241b | 257b | 273b |
| LINE 3 | 2a | 18a | 34a | 50a | 66a | 82a | 98a | 114a | 130a | 146a | 162a | 178a | 194a | 210a | 226a | 242a | 258a | 274a |
| LINE 32 | 16b | 32b | 48b | 64b | 80b | 96b | 112b | 128b | 144b | 160b | 176b | 192b | 208b | 224b | 240b | 256b | 272b | 288b |

1000

"288*a*", and "288*b*" will be referred to as coded bits.

INTERLEAVING APPARATUS

BACKGROUND OF THE INVENTION

1. Technical Field of the Invention

The present invention relates generally to an interleaving apparatus designed to rearrange a string of bits received or to be transmitted for eliminating errors locally occurring in the bit string.

2. Related Art

Recently, mobile communications systems such as portable telephones are in widespread use. Wireless communications systems such as mobile communications systems may experience local errors or burst errors taken place in a bit string to be received or transmitted. In order to minimize a lack of any bits caused by the burst errors, rearrangement of the bit string or interleaving is used.

Typical interleaving apparatuses are designed to subject a bit string to coding such as convolutional coding and interleaving for error correction and produces a coded and interleaved bit string. FIG. 7 shows an input bit string. FIG. 8 shows an interleaved and coded bit string. The interleaving is such that, for instance, a bit "1"(not shown) is coded and interleaved to produce a bit "1*a*" and a bit "1*b*" (not shown). In order to perform this function, the conventional interleaving apparatuses, as shown in FIG. 9, include a convolutional coding circuit 100, a bit storage circuit 200, a control circuit 300, and an order storage circuit 400.

The convolutional coding circuit 100 includes a plurality of registers A1 to A9 for convolutional coding. The convolutional coding 100 performs an operation C1=A1+A4+A5+A7+A9 and an operation C2=A2+A3+A4+A6+A8 on, for example, the first bit "1" in a bit stream to produce a bit "1*a*" and a bit "1*b*", respectively. Specifically, C1 and C2 are calculated using predetermined initial values as values of the registers A1 to A8 and the bit "1" as a value of the register A9. The convolutional coding circuit 100 outputs the bit "1*a*" and the bit "1*b*" from ports 110 and 120, respectively. Similarly, the convolutional coding circuit 100 produces bits "2*a*" and "2*b*" from the second bit "2" following the first bit "1" and also produces bits "288*a*" and "288*b*" from the last bit "288". In the following discussion, the bits "1*a*", "1*b*", . . . "288*a*", and "288*b*" will be referred to as coded bits.

The bit storage circuit 200 stores therein the coded bits in the order in which they are outputted from the convolutional coding circuit 100. The control circuit 300 rearranges the coded bits in the bit storage circuit 200 in the order 1000 stored in the order storage circuit 400. The order 1000, as shown in FIG. 10, represents rearrangement of the coded bits and identical with the order of bits in a coded and interleaved bit string. The control circuit 300 outputs the rearranged coded bits or the coded and interleaved bit string to an quadrature converter circuit (not shown).

However, the conventional interleaving apparatus needs to have storage locations for all bits in an input bit string in the bit storage circuit 200 for coding and interleaving the bit string. For example, when 288 bits are inputted, the bit storage circuit 200 needs to have 576 storage locations (=288×2). Usually, an interleaving apparatus designed to convolutinally code N input bits at a coding rate R requires storage locations of a number for storing N×R bits. However, portable telephones have usually a small space for mount of parts and circuits. Thus, addition of the coding and interleaving function to the portable telephones requires a decrease in storage location in the bit storage circuit 200.

SUMMARY OF THE INVENTION

It is therefore a principal object of the present invention to avoid the disadvantages of the prior art.

According to one aspect of the invention, there is provided an interleaving apparatus wherein a first bit string including a plurality of first bits is inputted to output a second bit string including a plurality of second bits each of which corresponds to one of the first bits and which are arranged in order different from that of the first bits, comprising: (a) a bit storage circuit storing therein the plurality of first bits; (b) an order storage circuit storing therein the order of the plurality of second bits; (c) a coding circuit producing a group of the second bits corresponding to one first bit by coding at least one of the first bits; (d) a control circuit transferring the first bits required to produce one of the second bits from the bit storage circuit to the coding circuit for producing the plurality of second bits according to the order; and (e) a selecting circuit selecting one of the produced group of the second bits according to the order.

In the preferred mode of the invention, the coding circuit is an error correction coding circuit.

The error correction coding circuit is a convolutional coding circuit coding the first bit specified by the one of the first bits for producing the group of second bits. The control circuit transfers the specified first bit.

The coding circuit may be a cyclic convolutional coding circuit which uses the one of the first bits and a result of coding of at least one of the first bits located ahead of the one of the first bits in the first bit string for producing the group of second bits and which includes a result storage circuit storing therein the result. The control circuit transfers the first bits from the bit storage circuit to the coding circuit and also transfers the result from the result storage circuit to the coding circuit.

The coding circuit performs coding for finding the result prior to coding to produce the plurality of second bits.

The result storage circuit stores a result of coding some of the first bits located at a given interval away from each other.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 2 is an illustration which shows a storage region of a bit storage circuit of the first embodiment;

FIG. 5 is an illustration which pre-operation values stored in a pre-operation value storage circuit of the second embodiment;

FIG. 7 is an illustration which shows a bit string inputted to an interleaving apparatus;

FIG. 8 is an illustration which a coded and interleaved bit string to be outputted from an interleaving apparatus;

FIG. 10 is an illustration which shows the order stored in an order storage circuit.

DESCRIPTION OF THE PREFERRED EMBODIMENTS

Figure 1:
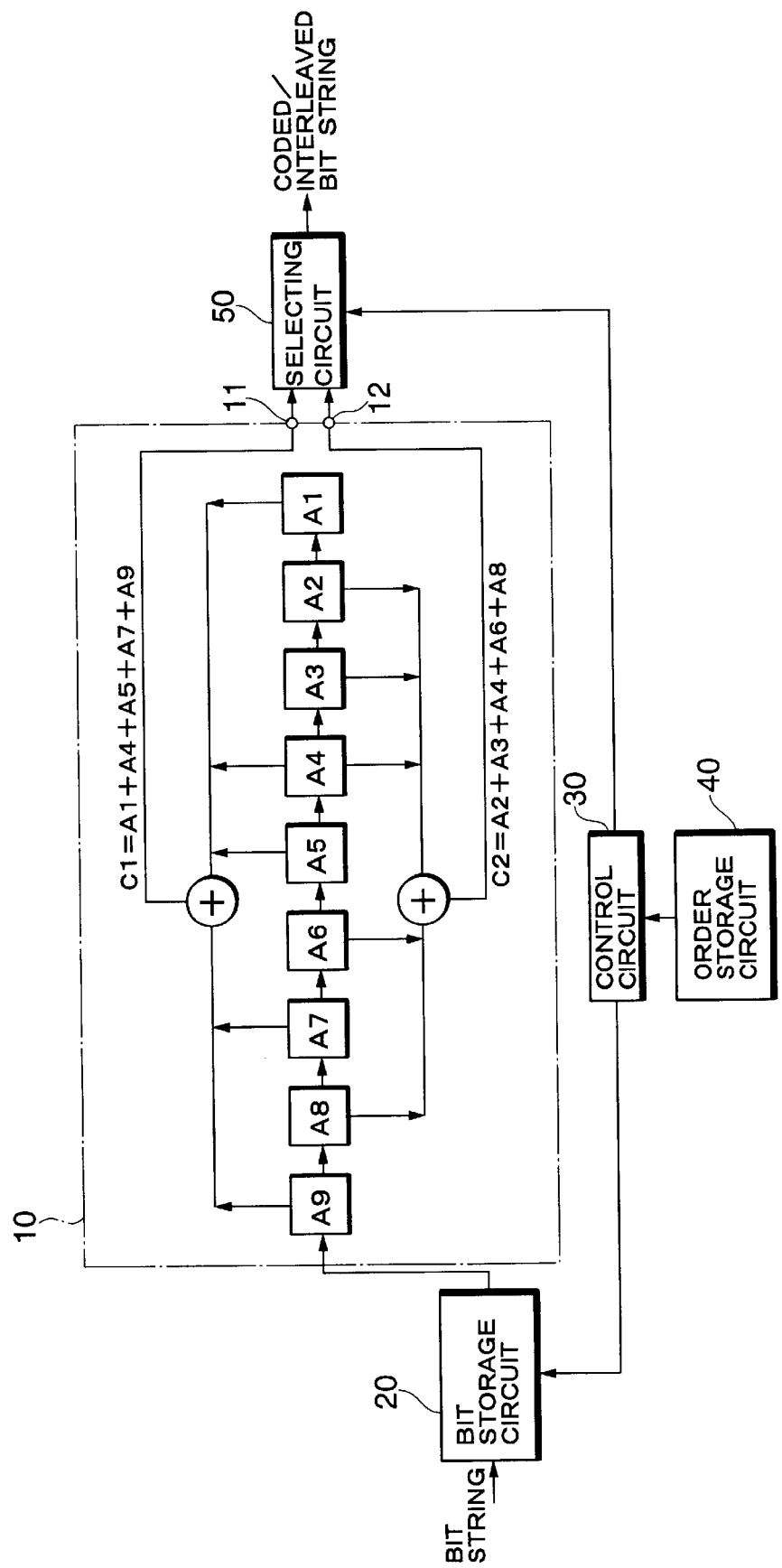
FIG. 1 is an illustration which shows an interleaving apparatus according to the first embodiment of the invention.

Referring now to the drawings, wherein like numbers refer to like parts in several views, particularly to FIG. 1, there is shown an interleaving apparatus according to the first embodiment of the invention.

The interleaving apparatus of this embodiment functions similar to the conventional one as discussed in the introductory part of this application. Specifically, the interleaving apparatus is designed to receive a bit string (288 bits), as shown in FIG. 7, and output a coded and interleaved bit string (576 bits), as shown in FIG. 8. In order to realize this function, the interleaving apparatus includes generally a convolutional coding circuit 10, a bit storage circuit 20, a control circuit 30, an order storage circuit 40, and a selecting circuit 50.

Figure 9:
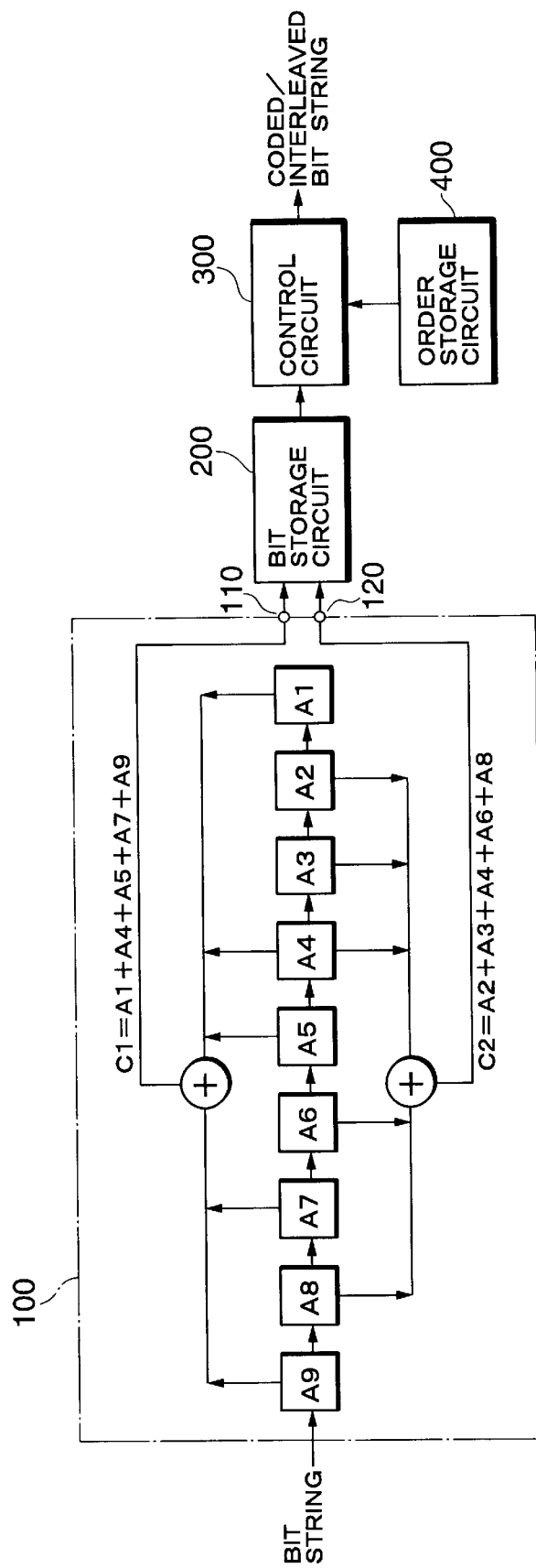
FIG. 9 is an illustration which shows a structure of a conventional interleaving apparatus.

The convolutional coding circuit 10 has the same structure and performs the same function as those of the convolutional coding circuit 100 shown in FIG. 9. Specifically, the convolutional coding circuit 10 performs the operations $C1=A1+A4+A5+A7+A9$ and $C2=A2+A3+A4+A6+A8$ on each input bit to produce a coded bit.

Figure 2:
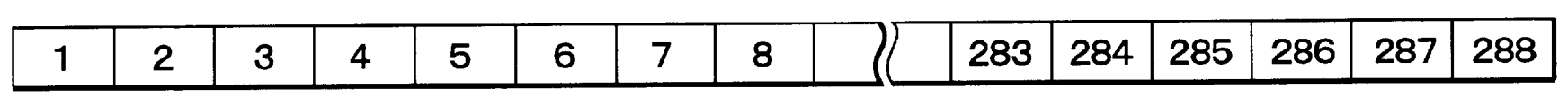

The bit storage circuit 20 stores bits temporality in the order they are inputted, but, unlike the conventional bit storage circuit 200, has only 288 storage locations, as shown in FIG. 2.

The control circuit 30 provides to the convolutional coding circuit 10 some of the bits stored in the bit storage circuit 20 reqiured to produce coded bits arising from each of the bits in the bit storage circuit 20. For example, when it is required to produce coded bits "$17a$" and "$17b$", a total of 9 bits including eight bits "9" to "16" preceding a bit "17" and the bit "17" are set in registers A1 to A9 of the convolutional coding circuit 10, respectively, after which operations C1 and C2 are carried out to output the coded bit "$17a$" and "$17b$" from ports 11 and 12, respectively. For coded bits "$1a$", "$1b$", . . . "$8a$", and "$8b$", since eight bits do not exist at bits positions preceding the bits "1" to "8", a predetermined initial value is used as the value of the register A in which no bit is to be set.

The control circuit 30, similar to the conventional control circuit 100, rearranges the coded bits while referring to the order 1000 which regulates rearrangement of the coded bits.

The order storage circuit 40, similar to the conventional order storage circuit 400, stores the order 1000.

The selecting circuit 50 selects one of two coded bits outputted simultaneously from the ports 11 and 12 according to an instruction given by the control circuit 30 based on the order 1000. For example, for producing a line 1 shown in FIG. 10, the bit "$1a$" that is one of two coded bits "$1a$" and "$1b$" outputted based on the bit "1" is selected, and the bit "$17a$" that is one of two coded bits "$17a$" and "$17b$" outputted based on the subsequent bit "17" is selected. Similarly, for producing a line 2, the bit "$1b$" that is one of the two coded bits "$1a$" and "$1b$" outputted based on the bit "1" is selected, and the bit "$17b$" that is one of the two coded bits "$17a$" and "$17b$" outputted based on the subsequent bit "17" is selected. In this manner, all lines 1 to 32 are produced. The interleaving apparatus outputs the thus coded and interleaved bit string to a following quadrature converter circuit (not shown).

Figure 3:
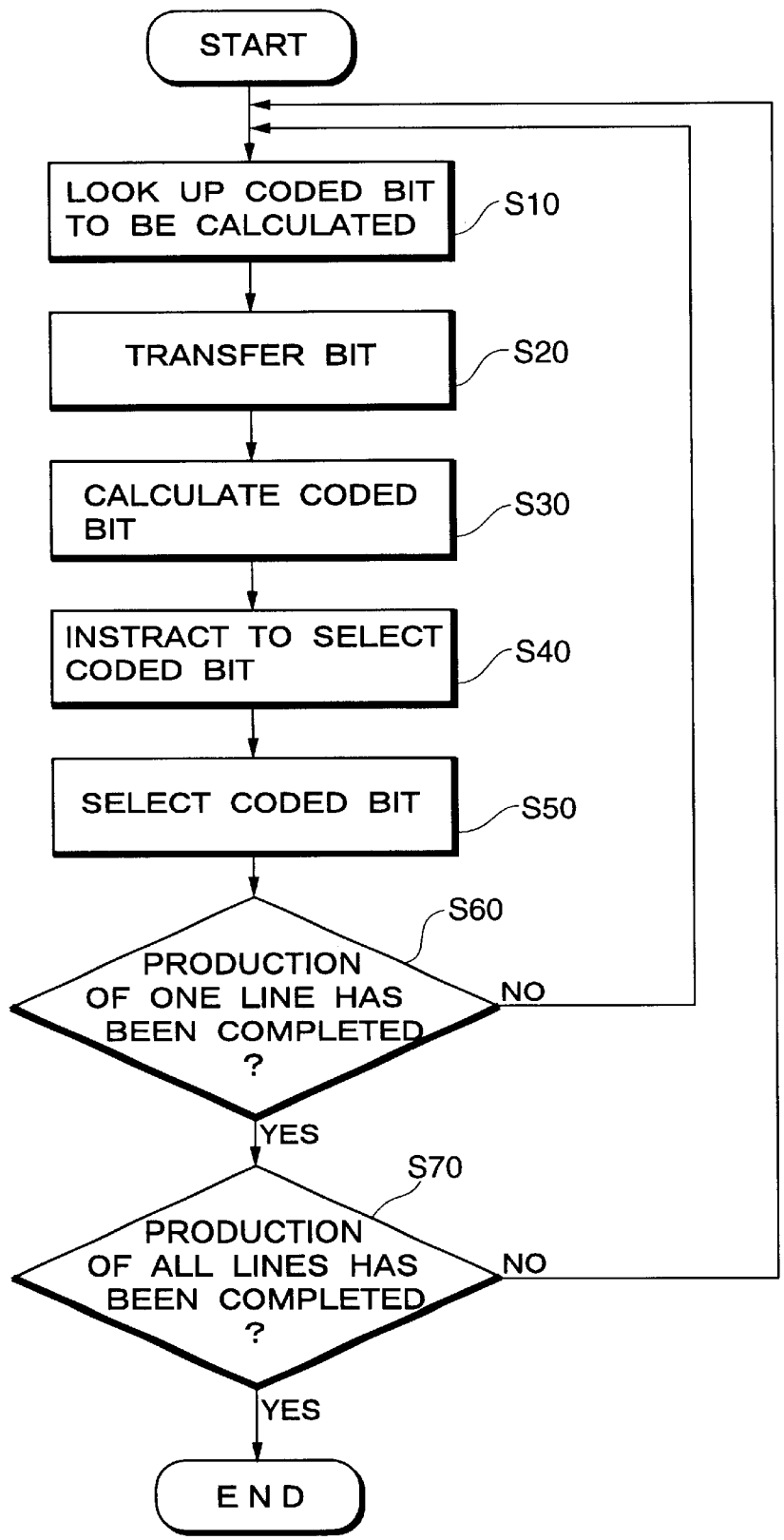
FIG. 3 is an illustration which shows an operation of the first embodiment.

An operation of the interleaving apparatus of the first embodiment will be discussed with reference to FIG. 3.

In step 10, the control circuit 30 looks up the order 1000 to determine that a coded bit to be calculated first is the coded bit "$1a$".

In step 20, the control circuit 30 transfers the bit "1" required to produce the coded bit "$1a$" from the bit storage circuit 20 to the convolutional coding circuit 10.

In step 30, the convolutional coding circuit 10 uses the transferred bit "1" and initial values to produce the coded bits "$1a$" and "$1b$". The convolutional coding circuit 10 outputs the coded bits "$1a$" and "$1b$" to the ports 11 and 12, respectively.

In step 40, since the line 1 is being produced, the control circuit 30 instructs the selecting circuit 50 to select the coded bit "$1a$" from the two coded bits outputted to the ports 11 and 12.

In step 50, the selecting circuit 50 receives the instruction from the control circuit 30 to selects the coded bit "$1a$" and outputs it to the quadrature converter circuit.

In step 60, steps 10 to 50 are repeated. Especially, in step 20, the control circuit 30 transfers a total of 9 bits including eight bits "9" to "16" located ahead of the bit "17" and the bit "17" from the bit storage circuit 20 to the convolutional coding circuit 10 for producing, for example, the coded bit "$17a$" and also transfers a total of 9 bits including eight bits "25" to "32" located ahead of the bit "33" and the bit "33" from the bit storage circuit 20 to the convolutional coding circuit 10 for producing the coded bit "$33a$". In this manner, steps 10 to 50 are carried out two times to complete the line 1. This means that the subsequent quadrature converter circuit is supplied with the coded bits "$1a$", "$17a$", "$33a$", . . . in that order during reproduction of the line 1.

In step 70, steps 10 to 60 are repeated. Especially, in step 40, the control circuit 10 instructs the selecting circuit 50 to select outputs of the ports 11 and 12 corresponding to the line being produced. For example, during production of the line 1, an instruction is given to select the coded bit outputted from the port 11. During reproduction of the line 2, an instruction is given to select the coded bit outputted from the port 12. During reproduction of the line 3, an instruction is given to select the coded bit outputted from the port 11. In this manner, steps 10 to 60 are carried out 32 times to produce the lines 1 to 32 to complete the coded and interleaved bit string, as shown in FIG. 8. This means that in the process of production of the coded and interleaved bit string, the quadrature converter circuit is supplied with the coded bits "$1a$", "$17a$", . . . , "$272b$", and "$288b$" in that order.

As described above, according to the interleaving apparatus of the first embodiment, the bit storage circuit 20 stores an input string of 288 bits temporarily. The control circuit 30 transfers some of the bits stored in the bit storage circuit 20 required to produce the coded bits according to the order 1000 stored in the order storage circuit 40 to the convolutional coding circuit 10, thereby eliminating the need for storage locations storing 576 bits which are required in the conventional bit storage 400. This provides for ease of installation of a coding and interleaving circuit in portable telephones which cannot take up much space for mounting parts and circuits.

An interleaving apparatus of the second embodiment will be described below which employs a cyclic convolutional coding circuit as the convolutional coding circuit.

Figure 4:
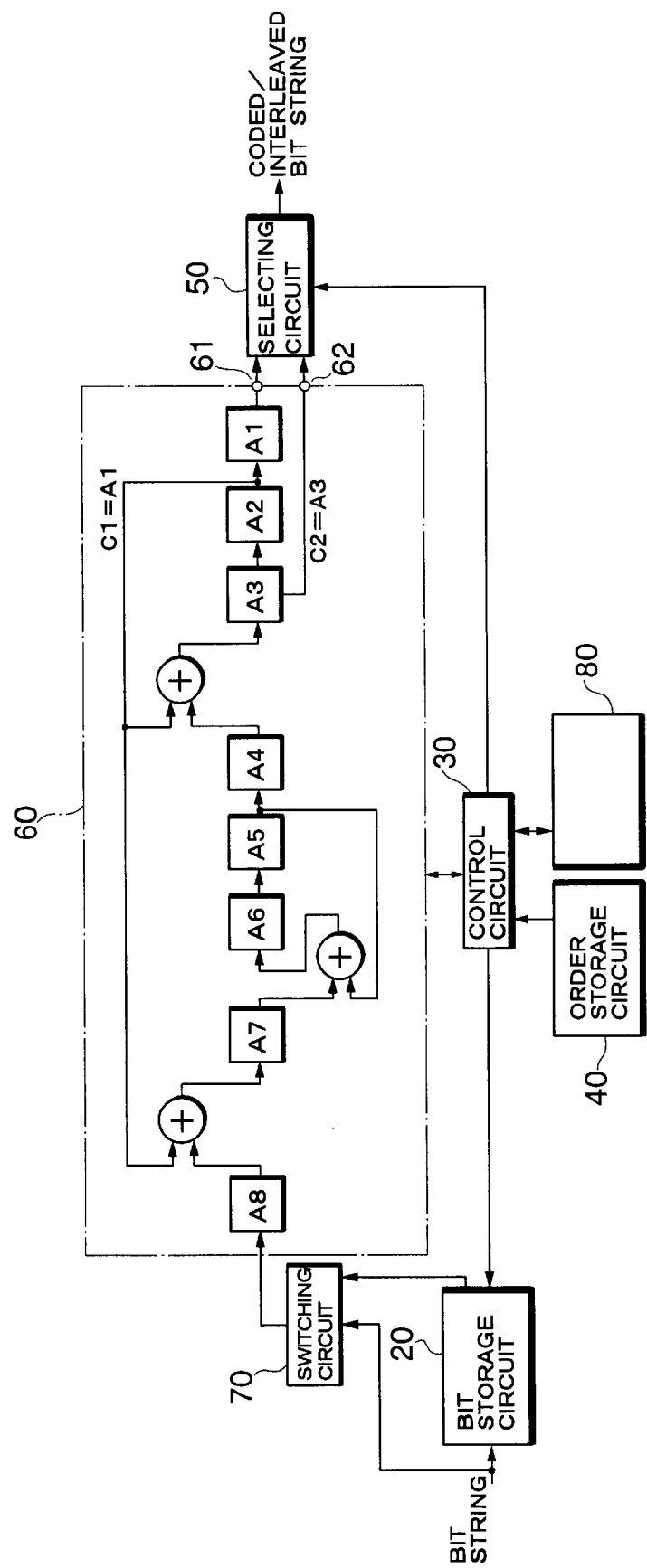
FIG. 4 is an illustration which shows a structure of an interleaving apparatus according to the second embodiment.

The cyclic convolutional coding circuit, unlike the non-cyclic convolutoinal coding circuit of the first embodiment, feeds back the value of the register A, as shown in FIG. 4. This causes an operation to produce, for example, the coded bit "1a" or "1b" to affects an operation to produce the following bit "3a" or "3b". In brief, one operation affects on a subsequent operation. In other words, execution of a subsequent operation requires accumulation of results of all proceeding operations or a reflection thereof. Operations for convolutional coding are, thus, complex and consumes much time in execution. The interleaving apparatus of the second embodiment aims at executing a cyclic convolutional operation using a decreased storage region. Specifically, a storage region of the bit storage circuit 20 of the first embodiment and a pre-operation value storage circuit 80 storing therein pre-operation values. The pre-operation values are values of the registers A1 to A8 which are required in an operation to produce coded bits and which are calculated prior to execution the operation to produce the coded bits.

The interleaving apparatus includes, in addition to the convolutional coding circuit 60, the bit storage circuit 20, the control circuit 30, the order storage circuit 40, the selecting circuit 50, the switching circuit 70, and the pre-operation value storage circuit 80. The bit storage circuit 20, the order storage circuit 40, and the selecting circuit 50 are basically identical with ones in the first embodiment, but the control circuit 30 is designed to perform another function in addition to activities of the control circuit 30 of the first embodiment.

The switching circuit 70, when determining a pre-operation value, gives a bit string being inputted to the convolutoinal coding 60 directly and when producing a coded bit, gives required ones of bits temporarily stored in the bit storage circuit 20 to the convolutional coding circuit 60.

The pre-operation value storage circuit 80 stores therein pre-operation values, as shown in FIG. 5. For example, the values of the registers A1 to A8 that are results of operations to produce coded bits "16a" and "16b" corresponding to the bit "16", values s1 to s8 are derived. For example, a pre-operation "~16" is an operation to produce the coded bit "16a" or "16b" executed after completion of all preceding operations.

The control circuit 30 gives the pre-operation values and bits required to produce the coded bits to the convolutional coding circuit 60. Specifically, the control circuit 30 transfers the required pre-operation values from the pre-operation value storage circuit 80 to the convolutional coding circuit 60 and also transfers the required bits from the bit storage circuit 20 to the convolutional coding circuit 60. For example, when an operation to produce the coded bit "17a" or "17b" is executed, the pre-operation values s1 to s8 used in the pre-operation "~16" on the bit "16" preceding the bit "17" and the bit "17" are supplied to the convolutional coding circuit 60. Similarly, when the coded bit "34a" or "34b" is produced, pre-operation values t1 to t8 used in a pre-operation "~32" and the bit "32" are supplied to the convolutional coding circuit 60, after which the bit "342 is supplied thereto.

Figure 6:
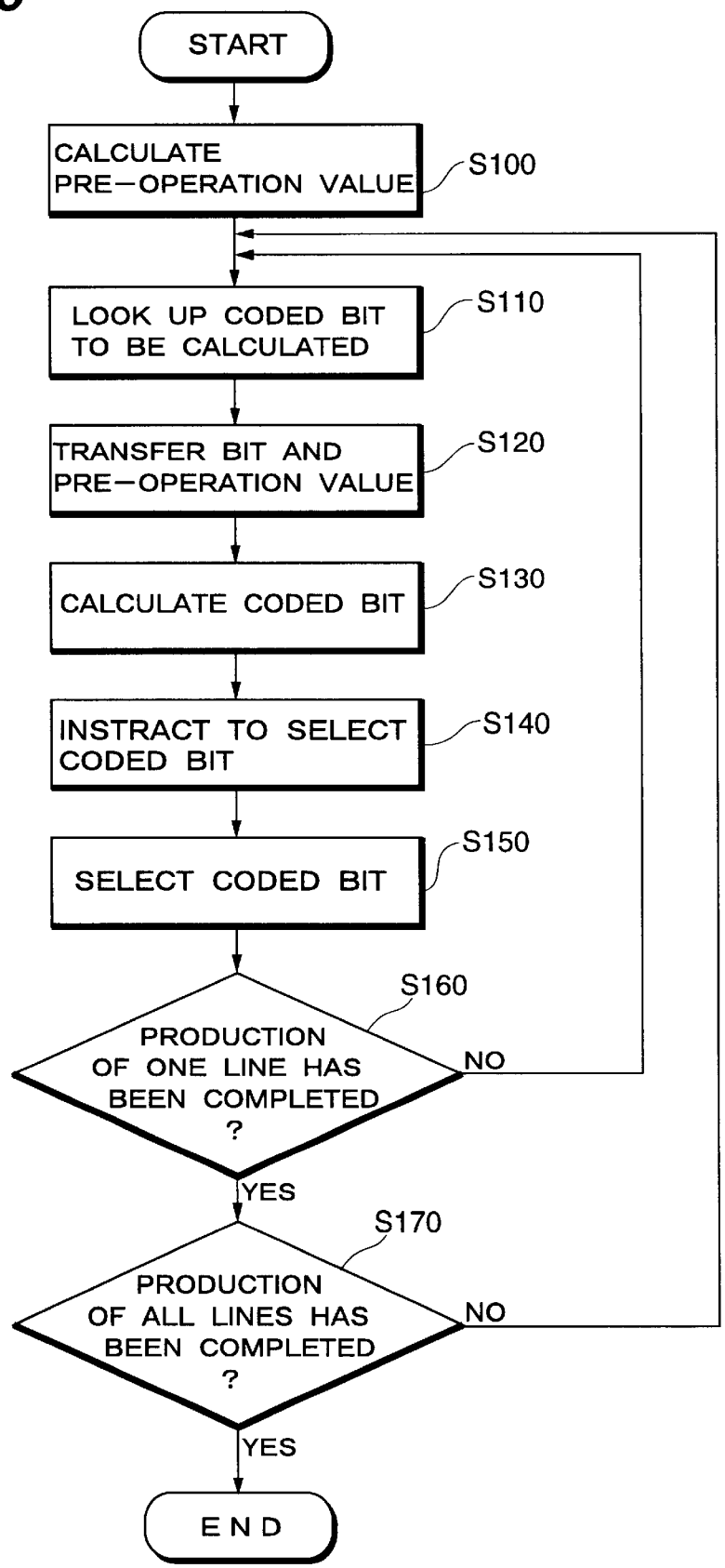
FIG. 6 is an illustration which shows an operation of the second embodiment.

An operation of the interleaving apparatus of the second embodiment will be described below with reference to FIG. 6.

In step 100, when a bit stream is inputted, the bit storage circuit 20 stores it. The convolutional coding circuit 60 is supplied with the bit string through the switching circuit 70. The convolutional coding circuit 60 inputs the bit stream, one bit into each of the registers A1 to A8, in sequence, to determine the pre-operation values. Upon completion of an operation on the bit "16", the values inputted into the registers A1 to A8 are stored in the pre-operation value storage circuit 80. Similarly, upon completion of an operation on each of the bits "32", "48", . . . "272", the values inputted into the registers A1 to A8 are stored in the pre-operation value storage circuit 80. In this manner, the pre-operation values used in the pre-operations "~16", "~32", "~48", . . . "~272" are stored in the pre-operation value storage circuit 80.

In step 110, the control circuit 30 looks up the order 1000 stored in the order storage circuit 40 to determine that a coded bit to be calculated first is the coded bit "1a".

In step 120, the control circuit 30 transfers the bit "1" required to produce to the coded bit "1a" from the bit storage circuit 20 to the convolutional coding circuit 60. The control circuit 30 determines whether pre-operation values are stored in the pre-operation storage circuit 80 or not which can be used in an operation on the bit "1". Since such pre-operation values are not stored in the pre-operation storage circuit 80, the control circuit 30 does not transfer the pre-operation values from the pre-operation storage circuit 80 to the convolutional coding circuit 601.

In step 130, the convolutional coding circuit 60 sets the received bit "1" and predetermined initial values in the registers A1 to A8. The convolutional coding circuit 60 executes operations C1 and C2 to produce the coded bits using the values set in the registers A1 to A8. The result of the operation C1, that is, the coded bit "1a" is outputted to the port 61, while the result of the operation C2, that is, the coded bit "1b" is outputted to the port 62.

In step 140, since the line 1 is being produced, the control circuit 30 instructs the selecting circuit 50 to output the coded bit "1a" from the port 61.

In step 150, the selecting circuit 50 receives the instruction from the control circuit 30 to selects the coded bit "1a" and outputs it to the quadrature converter circuit.

In step 160, steps 100 to 150 are repeated for other coded bits. Especially, in step 120, the control circuit 30 transfers the bit "17" and the pre-operation values s1 to s8 used in the pre-operation "~16" on the bit "16" to the convolutional coding circuit 60 in order to produce the coded bit "17a" following the coded bit "1a". Additionally, in order to produce the coded bit "50a" in the line 3, for instance, the control circuit 30 transfers the pre-operation values u1 to u8 used in the pre-operation "~48" on the bit "48" and bits "49" and "50" to the convolutional coding circuit 60. These operations are repeated 18 times to produce one line.

In step 170, steps 110 to 160 are repeated to produce all the lines 1 to 32. In this manner, the interleaving apparatus supplies the coded and interleaved bit string to the quadrature converter circuit.

As apparent from the above discussion, he interleaving apparatus of the second embodiment determines the pre-operation values useful for executing operations to produce coded bits prior to the operations to produce the coded bits so as to allow the operations to produce the coded bits to be carried out in any order, that is, the order specified by the order 1000. When a specified coded bit is calculated, pre-operation values determined to be most useful for the calculation and some bits required to calculate the specified coded bit based on the pre-operation values are provided to the convolutional coding circuit 60 without inputting all bits required for the calculation thereinto. Thus, even if the convolutional coding circuit 60 is a cyclic convolutional coding circuit whose amount of operation is great because it is necessary to reflect all results of operations carried out previously, the provision of the pre-operation value storage circuit 80 having a memory region required to store the pre-operation values in addition to the bit storage circuit 20 allows the operation time to be decreased.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the iention as set forth in the appended claims.

What is claimed is:

1. An interleaving apparatus wherein a first bit string including a plurality of first bits is inputted to output a second bit string including a plurality of second bits each of which corresponds to one of the first bits and which are arranged in order different from that of the first bits, comprising:

a bit storage circuit storing therein said plurality of first bits;

an order storage circuit storing therein the order of said plurality of second bits;

a coding circuit producing a group of the second bits corresponding to one first bit by coding at least one of the first bits;

a control circuit transferring the first bits required to produce one of the second bits from said bit storage circuit to said coding circuit for producing said plurality of second bits according to said order; and a selecting circuit selecting one of said produced group of the second bits according to said order.

2. An interleaving apparatus as set forth in claim 1, wherein said coding circuit is an error correction coding circuit.

3. An interleaving apparatus as set forth in claim 2, wherein said error correction coding circuit is a convolutional coding circuit coding the first bit specified by said one of the first bits for producing said group of second bits, and wherein said control circuit transfers said specified first bit.

4. An interleaving apparatus as set forth in claim 1, wherein said coding circuit is a cyclic convolutional coding circuit which uses said one of the first bits and a result of coding of at least one of the first bits located ahead of said one of the first bits in said first bit string for producing said group of second bits and which includes a result storage circuit storing therein said result, and wherein said control circuit transfers the first bits from said bit storage circuit to said coding circuit and also transfers said result from said result storage circuit to said coding circuit.

5. An interleaving apparatus as set forth in claim 4, wherein said coding circuit performs coding for finding said result prior to coding to produce said plurality of second bits.

6. An interleaving apparatus as set forth in claim 5, wherein said result storage circuit stores a result of coding some of the first bits located at a given interval away from each other.

* * * * *